United States Patent
Cho et al.

(10) Patent No.: US 10,743,102 B2
(45) Date of Patent: Aug. 11, 2020

(54) ELECTRONIC DEVICE HAVING STRUCTURE INCLUDING SENSOR AND SPEAKER

(71) Applicant: SAMSUNG ELECTRONICS CO., LTD., Suwon-si, Gyeonggi-do (KR)

(72) Inventors: Joonrae Cho, Seoul (KR); Byounghee Lee, Seoul (KR); Woojin Cho, Seoul (KR); Hochul Hwang, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/093,269

(22) PCT Filed: Apr. 14, 2017

(86) PCT No.: PCT/KR2017/004063
§ 371 (c)(1),
(2) Date: Oct. 12, 2018

(87) PCT Pub. No.: WO2017/183863
PCT Pub. Date: Oct. 26, 2017

(65) Prior Publication Data
US 2019/0166422 A1    May 30, 2019

(30) Foreign Application Priority Data
Apr. 19, 2016  (KR) .................. 10-2016-0047499

(51) Int. Cl.
*H04M 1/03*    (2006.01)
*H04M 1/02*    (2006.01)
(Continued)

(52) U.S. Cl.
CPC ................. *H04R 3/00* (2013.01); *G06F 1/16* (2013.01); *H04R 1/025* (2013.01); *H04R 1/345* (2013.01);
(Continued)

(58) Field of Classification Search
CPC .......... H04R 3/00; H04R 1/025; H04R 1/345; H04R 2499/11; G06F 1/16; G06F 1/1688; H05K 5/0217; H04M 1/04; H04M 1/026
See application file for complete search history.

(56) References Cited

U.S. PATENT DOCUMENTS

2008/0149417 A1*  6/2008  Dinh .................... H04M 1/03
                                                  181/145
2014/0112510 A1    4/2014  Yang et al.
(Continued)

FOREIGN PATENT DOCUMENTS

JP    2009296052 A  * 12/2009
KR    10-2014-0089768    7/2014
(Continued)

OTHER PUBLICATIONS

International Search Report for PCT/KR2017/004063, dated Jul. 13, 2017, 4 pages.
Written Opinion of the ISA for PCT/KR2017/004063, dated Jul. 13, 2017, 6 pages.

*Primary Examiner* — Ping Lee
(74) *Attorney, Agent, or Firm* — Nixon & Vanderhye, P.C.

(57) ABSTRACT

An electronic device according to an embodiment of the present invention may have a structure including a sensor and a speaker. The structure may comprise: a first passage portion connected to the speaker; a second passage portion connected to the sensor; and a shared passage portion connected to the first passage portion and the second passage portion and leading to the outside of the structure. According to an embodiment, a sound output from the speaker is emitted to the outside of the structure through the first passage portion and the common passage portion, and a medium introduced from the outside of the structure may come into contact with the sensor through the common (Continued)

passage portion and the second passage portion. Various other embodiments are possible.

16 Claims, 17 Drawing Sheets

(51) Int. Cl.
    *H04R 3/00*          (2006.01)
    *G06F 1/16*          (2006.01)
    *H04R 1/34*          (2006.01)
    *H04R 1/02*          (2006.01)
    *H05K 5/02*          (2006.01)

(52) U.S. Cl.
    CPC ........ H05K 5/0217 (2013.01); *H04R 2499/11* (2013.01)

(56) References Cited

U.S. PATENT DOCUMENTS

| | | |
|---|---|---|
| 2014/0193018 A1 | 7/2014 | Lim et al. |
| 2015/0219608 A1* | 8/2015 | Choi ................. G01N 33/0004 73/23.2 |
| 2015/0339904 A1 | 11/2015 | Puskarich |
| 2016/0323186 A1* | 11/2016 | Dillon .................... H04L 47/12 |

FOREIGN PATENT DOCUMENTS

| | | |
|---|---|---|
| KR | 10-2015-0035613 | 4/2015 |
| KR | 10-2015-0082044 | 7/2015 |
| KR | 10-2015-0092579 | 8/2015 |

\* cited by examiner

ELECTRONIC DEVICE HAVING STRUCTURE INCLUDING SENSOR AND SPEAKER

This application is the U.S. national phase of International Application No. PCT/KR2017/004063 filed 14 Apr. 2017, which designated the U.S. and claims priority to KR Patent Application No. 10-2016-0047499 filed 19 Apr. 2016, the entire contents of each of which are hereby incorporated by reference.

TECHNICAL FIELD

Various embodiments of the present disclosure relate to an electronic device including a structure for performance improvement of the speaker and sensor of the electronic device.

BACKGROUND ART

Recently, electronic devices, such as a smart phone, a tablet PC, a desktop PC, a portable multimedia player (PMP), an MP3 player and a wearable device, come into wide use. Users can use various types of content through such various electronic devices.

A recent electronic device includes a speaker and sensor in order to provide various functions to a user. The electronic device may output a sound to the outside through the speaker, and may detect the state and surrounding environment of the electronic device using the sensor. In this case, the electronic device may include a discharge port through which a sound output through the speaker can be discharged. Furthermore, the electronic device may include a passage connected from the outside to the sensor so that a medium (e.g., air) can come into contact with the sensor in order to detect a surrounding environment using the sensor. In this case, if the electronic device includes a discharge hole for a sound and a passage for a medium, respectively, there is a problem in that performance of the speaker and the sensor cannot be optimized due to a spatial limit.

SUMMARY

Various embodiments of the present disclosure are to provide an electronic device including a structure on which a speaker and a sensor have been mounted, for optimizing performance of the speaker and the sensor.

An electronic device according to an embodiment of the present disclosure may include a structure configured to include a sensor and a speaker. The structure may be configured to include a first passage portion connected to the speaker, a second passage portion connected to the sensor, and a common passage portion connected to the first passage portion and the second passage portion to communicate with the outside of the structure. In accordance with one embodiment, a sound output by the speaker may be discharged to the outside of the structure through the first passage portion and the common passage portion. A medium introduced from the outside of the structure may come into contact with the sensor through the common passage portion and the second passage portion.

The electronic device according to various embodiments of the present disclosure can provide the structure for optimizing performance of the sensor and the speaker.

The electronic device according to various embodiments of the present disclosure can widely secure a valid space and improve performance of the sensor and the speaker using the passage for the sensing of the sensor and the passage for discharging a sound of the speaker in common.

DETAILED DESCRIPTION OF EXAMPLE EMBODIMENTS

Figure 1:
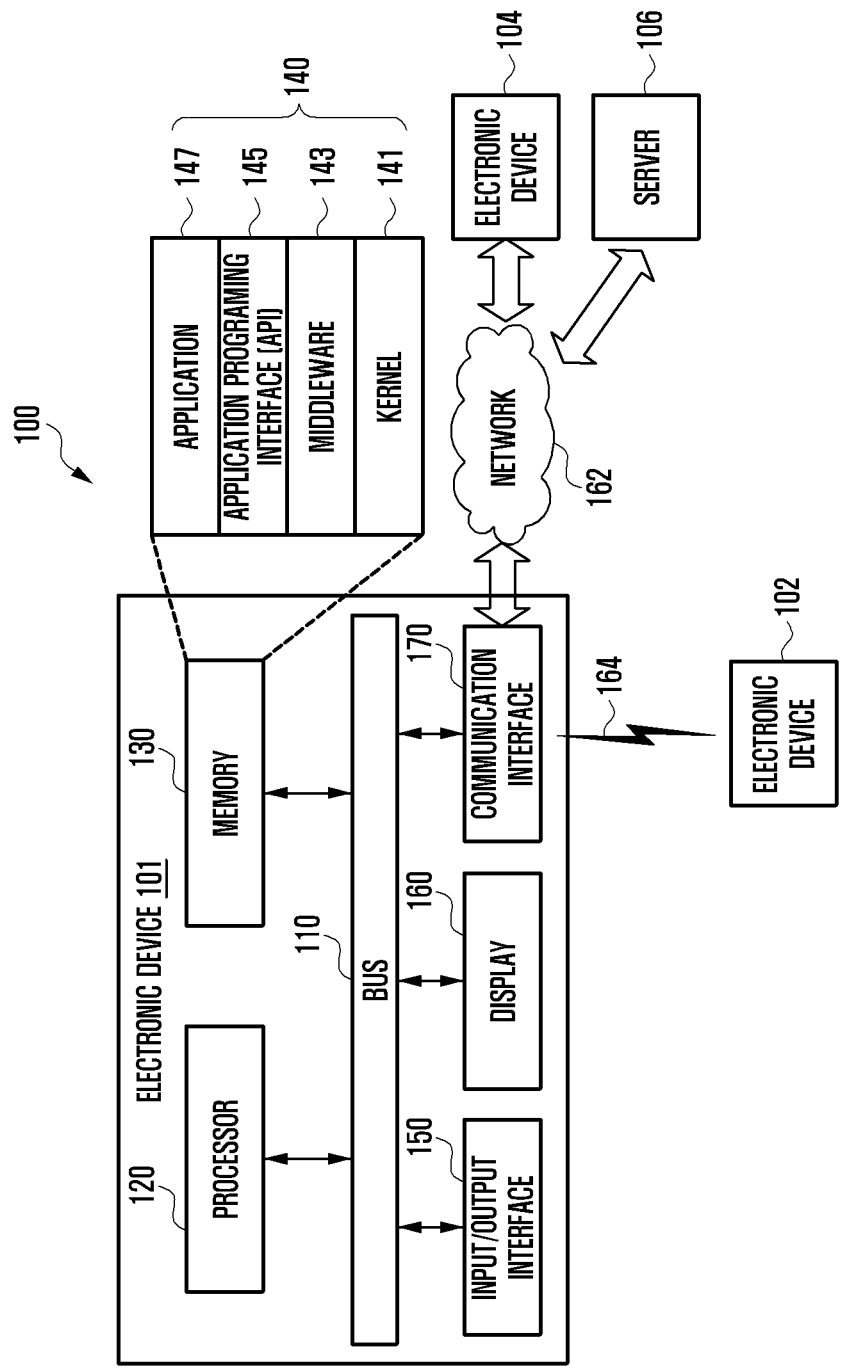
FIG. 1 shows an electronic device in a network environment according to various embodiments of the present disclosure.

Hereinafter, various embodiments of the present disclosure may be described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar elements may be marked by similar reference numerals. The terms of a singular form may include plural forms unless otherwise specified. In this disclosure, the expressions "A or B", "at least one of A or/and B", or "one or more of A or/and B", and the like may include any and all combinations of one or more of the associated listed items. The terms, such as "first", "second", and the like may be used to refer to various elements regardless of the order and/or the priority and to distinguish the relevant elements from other elements, but do not limit the elements. When an element (e.g., a first element) is referred to as being "(operatively or communicatively) coupled with/to" or "connected to" another element (e.g., a second element), the element may be directly coupled with/to or connected to the other element or an intervening element (e.g., a third element) may be present.

According to the situation, the expression "configured to" used in this disclosure may be used as, for example, the expression "suitable for", "having the capacity to", "adapted to", "made to", "capable of", or "designed to" in hardware or software. The expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

An electronic device according to various embodiments of this disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, media boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, drones, automatic teller's machines (ATMs), points of sales (POSs) of stores, or internet of things (e.g., light bulbs, various sensors, sprinkler devices, fire alarms, thermostats, street lamps, toasters, exercise equipment, hot water tanks, heaters, boilers, and the like). According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be a flexible electronic device or a combination of two or more above-described devices. Furthermore, an electronic device according to an embodiment of this disclosure may not be limited to the above-described electronic devices. In this disclosure, the term "user" may refer to a person who uses an electronic device or may refer to a device (e.g., an artificial intelligence electronic device) that uses the electronic device.

Referring to FIG. 1, according to various embodiments, an electronic device 101 in a network environment is described. The electronic device 101 may include a bus 110, a processor 120, a memory 130, an input/output interface 150, a display 160, and a communication interface 170. According to an embodiment, the electronic device 101 may not include at least one of the above-described elements or may further include other element(s). The bus 110 may interconnect the above-described elements 110 to 170 and may include a circuit for conveying communications (e.g., a control message and/or data) among the above-described elements. The processor 120 may include one or more of a central processing unit (CPU), an application processor (AP), or a communication processor (CP). For example, the processor 120 may perform an arithmetic operation or data processing associated with control and/or communication of at least other elements of the electronic device 101.

The memory 130 may include a volatile and/or nonvolatile memory. For example, the memory 130 may store instructions or data associated with at least one other element(s) of the electronic device 101. According to an embodiment, the memory 130 may store software and/or a program 140. The program 140 may include, for example, a kernel 141, a middleware 143, an application programming interface (API) 145, and/or an application program (or "an application") 147. At least a part of the kernel 141, the middleware 143, or the API 145 may be referred to as an "operating system (OS)". For example, the kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete elements of the electronic device 101 so as to control or manage system resources.

The middleware 143 may perform, for example, a mediation role such that the API 145 or the application program 147 communicates with the kernel 141 to exchange data. Furthermore, the middleware 143 may process one or more task requests received from the application program 147 according to a priority. For example, the middleware 143 may assign the priority, which makes it possible to use a system resource (e.g., the bus 110, the processor 120, the memory 130, or the like) of the electronic device 101, to at least one of the application program 147 and may process the one or more task requests. The API 145 may be an interface through which the application program 147 controls a function provided by the kernel 141 or the middleware 143, and may include, for example, at least one interface or function (e.g., a command or an instruction) for a file control, a window control, image processing, a character control, or the like. The input/output interface 150 may transmit an instruction or data input from a user or another external device, to other element(s) of the electronic device 101 or may output an instruction or data, received from other element(s) of the electronic device 101, to a user or another external device.

The display 160 may include, for example, a liquid crystal display (LCD), a light-emitting diode (LED) display, an organic LED (OLED) display, a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen or a part of a user's body. For example, the communication interface 170 may establish communication between the electronic device 101 and an external device (e.g., the first electronic device 102, the second electronic device 104, or the server 106). For example, the communication interface 170 may be connected to the network 162 over wireless communication or wired communication to communicate with the external device (e.g., the second electronic device 104 or the server 106).

For example, the wireless communication may include cellular communication using at least one of long-term evolution (LTE), LTE Advanced (LTE-A), Code Division Multiple Access (CDMA), Wideband CDMA (WCDMA), Universal Mobile Telecommunications System (UMTS), Wireless Broadband (WiBro), Global System for Mobile Communications (GSM), or the like. The wireless communication may include at least one of wireless fidelity (Wi-Fi), Bluetooth, Bluetooth low energy (BLE), Zigbee, near field communication (NFC), magnetic stripe transmission (MST), radio frequency (RF), a body area network, or the like. According to an embodiment, the wireless communication may include GNSS. The GNSS may be one of, for example, a global positioning system (GPS), a global navigation satellite system (Glonass), a Beidou navigation satellite system (hereinafter referred to as "Beidou"), or an European global satellite-based navigation system (hereinafter referred to as "Galileo"). Hereinafter, in this disclosure, "GPS" and "GNSS" may be interchangeably used. The wired communication may include at least one of, for example, a universal serial bus (USB), a high definition multimedia interface (HDMI), a recommended standard-232 (RS-232), power line communication, a plain old telephone service (POTS), or the like. The network 162 may include at least one of telecommunications networks, for example, a computer network (e.g., LAN or WAN), an Internet, or a telephone network.

Each of the first and second external electronic devices 102 and 104 may be a device of which the type is different from or the same as that of the electronic device 101. According to various embodiments, all or a portion of operations that the electronic device 101 will perform may be executed by another or plural electronic devices (e.g., the first electronic device 102, the second electronic device 104 or the server 106). According to an embodiment, in the case where the electronic device 101 executes any function or service automatically or in response to a request, the electronic device 101 may not perform the function or the service internally, but, alternatively additionally, it may request at least a portion of a function associated with the electronic device 101 at other electronic device (e.g., the electronic device 102 or 104 or the server 106). The other electronic device (e.g., the electronic device 102 or 104 or the server 106) may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
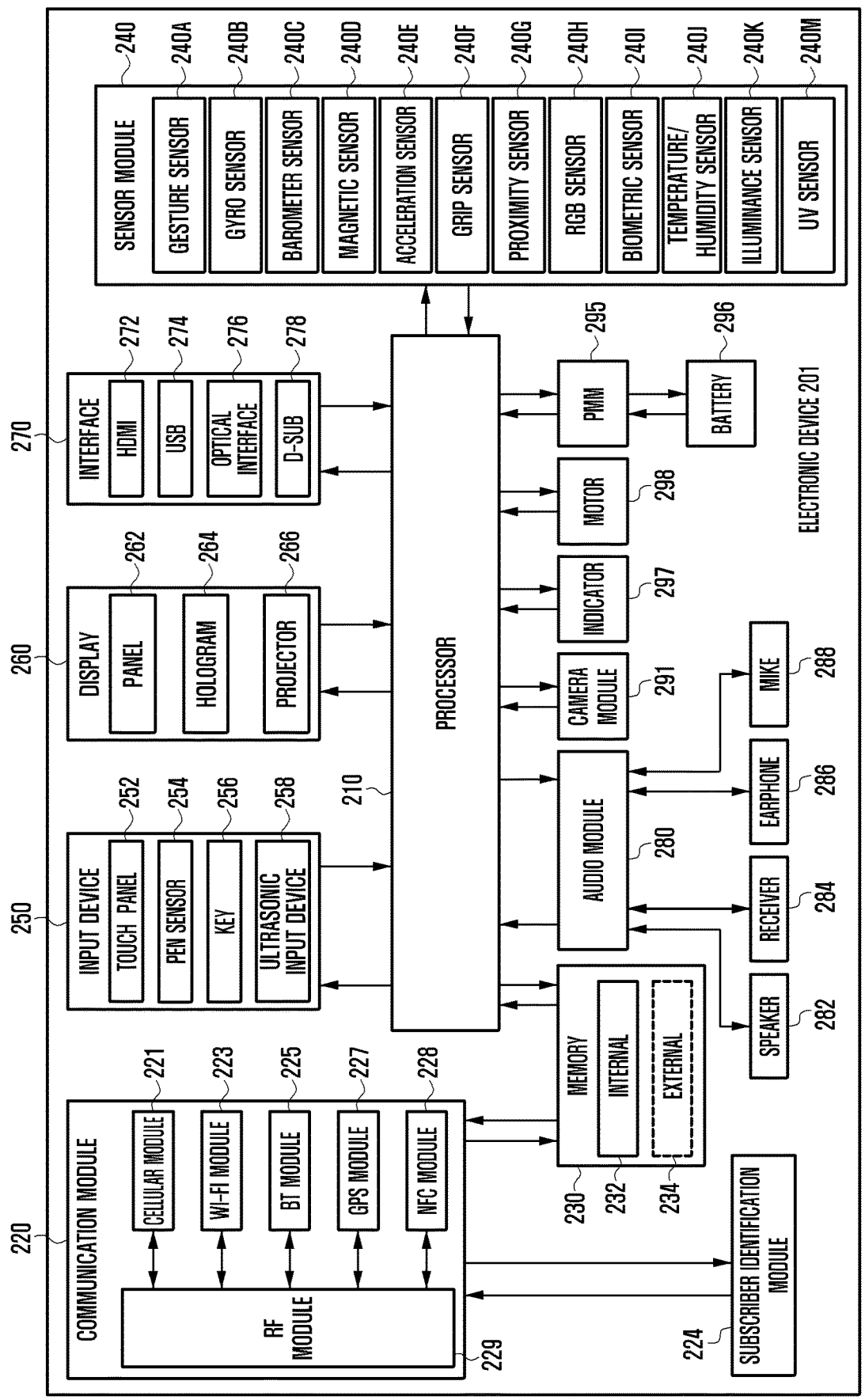
FIG. 2 is a block diagram of an electronic device according to various embodiments of the present disclosure.

FIG. 2 illustrates a block diagram of an electronic device, according to various embodiments. An electronic device 201 may include, for example, all or a part of the electronic device 101 illustrated in FIG. 1. The electronic device 201 may include one or more processors (e.g., an application processor (AP)) 210, a communication module 220, a subscriber identification module 224, a memory 230, a sensor module 240, an input device 250, a display 260, an interface 270, an audio module 280, a camera module 291, a power management module 295, a battery 296, an indicator 297, and a motor 298. For example, the processor 210 may be implemented with a System on Chip (SoC). According to an embodiment, the processor 210 may further include a graphic processing unit (GPU) and/or an image signal processor. The processor 210 may include at least a part (e.g., a cellular module 221) of elements illustrated in FIG. 2. The processor 210 may load an instruction or data, which is received from at least one of other elements (e.g., a nonvolatile memory), into a volatile memory and process the loaded instruction or data. The processor 210 may store result data in the nonvolatile memory.

The communication module 220 may be configured the same as or similar to the communication interface 170 of FIG. 1. The communication module 220 may include the cellular module 221, a Wi-Fi module 223, a Bluetooth (BT) module 225, a GNSS module 227, a near field communication (NFC) module 228, and a radio frequency (RF) module 229. The cellular module 221 may provide, for example, voice communication, video communication, a character service, an Internet service, or the like over a communication network. According to an embodiment, the cellular module 221 may perform discrimination and authentication of the electronic device 201 within a communication network by using the subscriber identification module (e.g., a SIM card) 224. According to an embodiment, the cellular module 221 may perform at least a portion of functions that the processor 210 provides. According to an embodiment, the cellular module 221 may include a communication processor (CP). According to an embodiment, at least a part (e.g., two or more) of the cellular module 221, the Wi-Fi module 223, the BT module 225, the GNSS module 227, or the NFC module 228 may be included within one Integrated Circuit (IC) or an IC package. For example, the RF module 229 may transmit and receive a communication signal (e.g., an RF signal). For example, the RF module 229 may include a transceiver, a power amplifier module (PAM), a frequency filter, a low noise amplifier (LNA), an antenna, or the like. According to another embodiment, at least one of the cellular module 221, the Wi-Fi module 223, the BT module 225, the GNSS module 227, or the NFC module 228 may transmit and receive an RF signal through a separate RF module. The subscriber identification module 224 may include, for example, a card and/or embedded SIM that includes a subscriber identification module and may include unique identify information (e.g., integrated circuit card identifier (ICCID)) or subscriber information (e.g., international mobile subscriber identity (IMSI)).

The memory 230 (e.g., the memory 130) may include an internal memory 232 or an external memory 234. For example, the internal memory 232 may include at least one of a volatile memory (e.g., a dynamic random access memory (DRAM), a static RAM (SRAM), a synchronous DRAM (SDRAM), or the like), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory, a hard drive, or a solid state drive (SSD). The external memory 234 may include a flash drive such as compact flash (CF), secure digital (SD), micro secure digital (Micro-SD), mini secure digital (Mini-SD), extreme digital (xD), a multimedia card (MMC), a memory stick, or the like. The external memory 234 may be operatively and/or physically connected to the electronic device 201 through various interfaces.

The sensor module 240 may measure, for example, a physical quantity or may detect an operation state of the electronic device 201. The sensor module 240 may convert the measured or detected information to an electric signal. For example, the sensor module 240 may include at least one of a gesture sensor 240A, a gyro sensor 240B, a barometric pressure sensor 240C, a magnetic sensor 240D, an acceleration sensor 240E, a grip sensor 240F, the proximity sensor 240G, a color sensor 240H (e.g., red, green, blue (RGB) sensor), a biometric sensor 240I, a temperature/humidity sensor 240J, an illuminance sensor 240K, or an UV sensor 240M. Although not illustrated, additionally or generally, the sensor module 240 may further include, for example, an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 240 may further include a control circuit for controlling at least one or more sensors included therein. According to an embodiment, the electronic device 201 may further include a processor that is a part of the processor 210 or independent of the processor 210 and is configured to control the sensor module 240. The processor may control the sensor module 240 while the processor 210 remains at a sleep state.

The input device 250 may include, for example, a touch panel 252, a (digital) pen sensor 254, a key 256, or an ultrasonic input unit 258. For example, the touch panel 252 may use at least one of capacitive, resistive, infrared and ultrasonic detecting methods. Also, the touch panel 252 may further include a control circuit. The touch panel 252 may further include a tactile layer to provide a tactile reaction to a user. The (digital) pen sensor 254 may be, for example, a part of a touch panel or may include an additional sheet for recognition. The key 256 may include, for example, a physical button, an optical key, or a keypad. The ultrasonic input device 258 may detect (or sense) an ultrasonic signal, which is generated from an input device, through a microphone (e.g., a microphone 288) and may check data corresponding to the detected ultrasonic signal.

The display 260 (e.g., the display 160) may include a panel 262, a hologram device 264, a projector 266, and/or a control circuit for controlling the panel 262, the hologram device 264, or the projector 266. The panel 262 may be implemented, for example, to be flexible, transparent or wearable. The panel 262 and the touch panel 252 may be integrated into a single module. According to an embodiment, the panel 262 may include a pressure sensor (or force sensor) that measures the intensity of touch pressure by a user. The pressure sensor may be implemented integrally with the touch panel 252, or may be implemented as at least one sensor separately from the touch panel 252. The hologram device 264 may display a stereoscopic image in a space using a light interference phenomenon. The projector 266 may project light onto a screen so as to display an image. For example, the screen may be arranged in the inside or the outside of the electronic device 201. The interface 270 may include, for example, a high-definition multimedia interface (HDMI) 272, a universal serial bus (USB) 274, an optical interface 276, or a D-subminiature (D-sub) 278. The interface 270 may be included, for example, in the communication interface 170 illustrated in FIG. 1. Additionally or generally, the interface 270 may include, for example, a mobile high definition link (MHL) interface, a SD card/multi-media card (MMC) interface, or an infrared data association (IrDA) standard interface.

The audio module 280 may convert a sound and an electric signal in dual directions. At least a part of the audio module 280 may be included, for example, in the input/output interface 150 illustrated in FIG. 1. The audio module 280 may process, for example, sound information that is input or output through a speaker 282, a receiver 284, an earphone 286, or the microphone 288. For example, the camera module 291 may shoot a still image or a video. According to an embodiment, the camera module 291 may include at least one or more image sensors (e.g., a front sensor or a rear sensor), a lens, an image signal processor (ISP), or a flash (e.g., an LED or a xenon lamp). The power management module 295 may manage, for example, power of the electronic device 201. According to an embodiment, a power management integrated circuit (PMIC), a charger IC, or a battery or fuel gauge may be included in the power management module 295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, a rectifier, or the like. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, and the like. The motor 298 may convert an electrical signal into a mechanical vibration and may generate the following effects: vibration, haptic, and the like. The electronic device 201 may include a processing device (e.g., a GPU) for supporting a mobile TV. The processing device for supporting the mobile TV may process media data according to the standards of digital multimedia broadcasting (DMB), digital video broadcasting (DVB), MediaFLO™, or the like. Each of the above-mentioned elements of the electronic device according to various embodiments of the present disclosure may be configured with one or more components, and the names of the elements may be changed according to the type of the electronic device. In various embodiments, some elements of the electronic device (e.g., the electronic device 201) may be omitted or other additional elements may be added. Furthermore, some of the elements of the electronic device may be combined with each other so as to form one entity, so that the functions of the elements may be performed in the same manner as before the combination.

Figure 3:
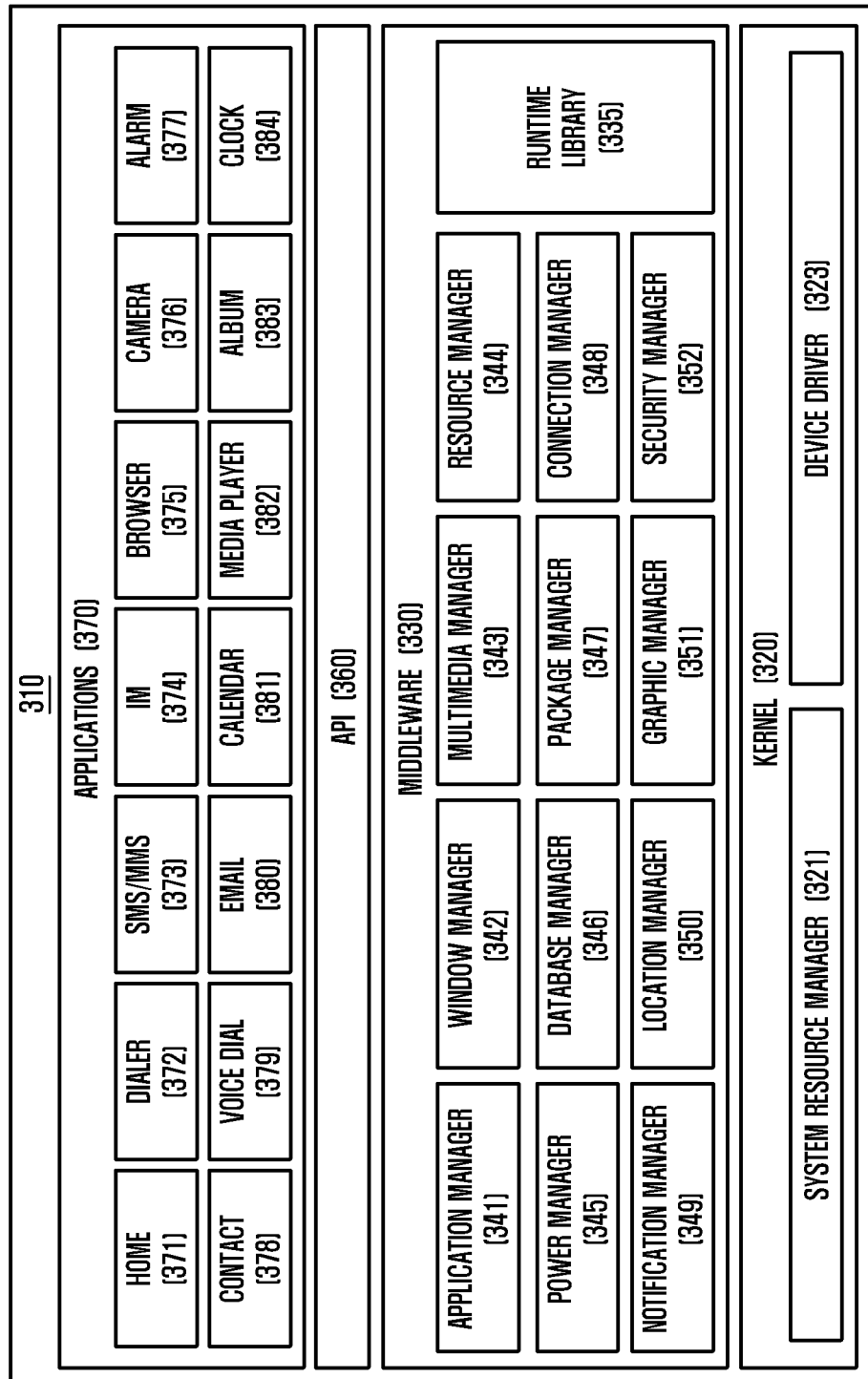
FIG. 3 is a block diagram of a program module according to various embodiments of the present disclosure.

FIG. 3 illustrates a block diagram of a program module, according to various embodiments. According to an embodiment, a program module 310 (e.g., the program 140) may include an operating system (OS) to control resources associated with an electronic device (e.g., the electronic device 101), and/or diverse applications (e.g., the application program 147) driven on the OS. The OS may be, for example, Android™, iOS™, Windows™, Symbian™, Tizen™, or Bada™. The program module 310 may include a kernel 320 (e.g., the kernel 141), a middleware 330 (e.g., the middleware 143), an application programming interface (API) 360 (e.g., the API 145), and/or an application 370 (e.g., the application program 147). At least a portion of the program module 310 may be preloaded on an electronic device or may be downloadable from an external electronic device (e.g., the first electronic device 102, the second electronic device 104, the server 106, or the like).

The kernel 320 (e.g., the kernel 141) may include, for example, a system resource manager 321 or a device driver 323. The system resource manager 321 may control, allocate, or retrieve system resources. According to an embodiment, the system resource manager 321 may include a process managing unit, a memory managing unit, a file system managing unit, or the like. The device driver 323 may include, for example, a display driver, a camera driver, a Bluetooth driver, a shared memory driver, a USB driver, a keypad driver, a Wi-Fi driver, an audio driver, or an inter-process communication (IPC) driver. The middleware 330 may provide, for example, a function that the application 370 needs in common, or may provide diverse functions to the application 370 through the API 360 to allow the application 370 to efficiently use limited system resources of the electronic device. According to an embodiment, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, or a security manager 352.

The runtime library 335 may include, for example, a library module that is used by a compiler to add a new function through a programming language while the application 370 is being executed. The runtime library 335 may perform input/output management, memory management, or capacities about arithmetic functions. The application manager 341 may manage, for example, a life cycle of at least one application of the application 370. The window manager 342 may manage a graphic user interface (GUI) resource that is used in a screen. The multimedia manager 343 may identify a format necessary for playing diverse media files, and may perform encoding or decoding of media files by using a codec suitable for the format. The resource manager 344 may manage resources such as a memory space or source code of the application 370. The power manager 345 may manage a battery or power, and may provide power information for an operation of an electronic device. According to an embodiment, the power manager 345 may operate with a basic input/output system (BIOS). The database manager 346 may generate, search for, or modify database that is to be used in the application 370. The package manager 347 may install or update an application that is distributed in the form of package file.

The connectivity manager 348 may manage, for example, wireless connection. The notification manager 349 may provide an event, for example, arrival message, appointment, or proximity notification to a user. For example, the location manager 350 may manage location information about an electronic device. The graphic manager 351 may manage a graphic effect that is provided to a user, or manage a user interface relevant thereto. The security manager 352 may provide, for example, system security or user authentication. According to an embodiment, the middleware 330 may include a telephony manager for managing a voice or video call function of the electronic device or a middleware module that combines diverse functions of the above-described elements. According to an embodiment, the middleware 330 may provide a module specialized to each OS kind to provide differentiated functions. Additionally, the middleware 330 may dynamically remove a part of the preexisting elements or may add new elements thereto. The API 360 may be, for example, a set of programming functions and may be provided with a configuration that is variable depending on an OS. For example, in the case where an OS is the android or the iOS, it may provide one API set per platform. In the case where an OS is the tizen, it may provide two or more API sets per platform.

The application 370 may include, for example, applications such as a home 371, a dialer 372, an SMS/MMS 373, an instant message (IM) 374, a browser 375, a camera 376, an alarm 377, a contact 378, a voice dial 379, an e-mail 380, a calendar 381, a media player 382, an album 383, a watch 384, health care (e.g., measuring an exercise quantity, blood sugar, or the like) or offering of environment information (e.g., information of barometric pressure, humidity, temperature, or the like). According to an embodiment, the application 370 may include an information exchanging application to support information exchange between an electronic device and an external electronic device. The information exchanging application may include, for example, a notification relay application for transmitting specific information to an external electronic device, or a device management application for managing the external electronic device. For example, the notification relay application may include a function of transmitting notification information, which arise from other applications, to an external electronic device or may receive, for example, notification information from an external electronic device and provide the notification information to a user. The device management application may install, delete, or update for example, a function (e.g., turn-on/turn-off of an external electronic device itself (or a part of components) or adjustment of brightness (or resolution) of a display) of the external electronic device which communicates with the electronic device, and an application running in the external electronic device. According to an embodiment, the application 370 may include an application (e.g., a health care application of a mobile medical device) that is assigned in accordance with an attribute of an external electronic device. According to an embodiment, the application 370 may include an application that is received from an external electronic device. At least a portion of the program module 310 may be implemented by software, firmware, hardware (e.g., the processor 210), or a combination (e.g., execution) of two or more thereof, and may include modules, programs, routines, sets of instructions, processes, or the like for performing one or more functions.

Figure 4A:
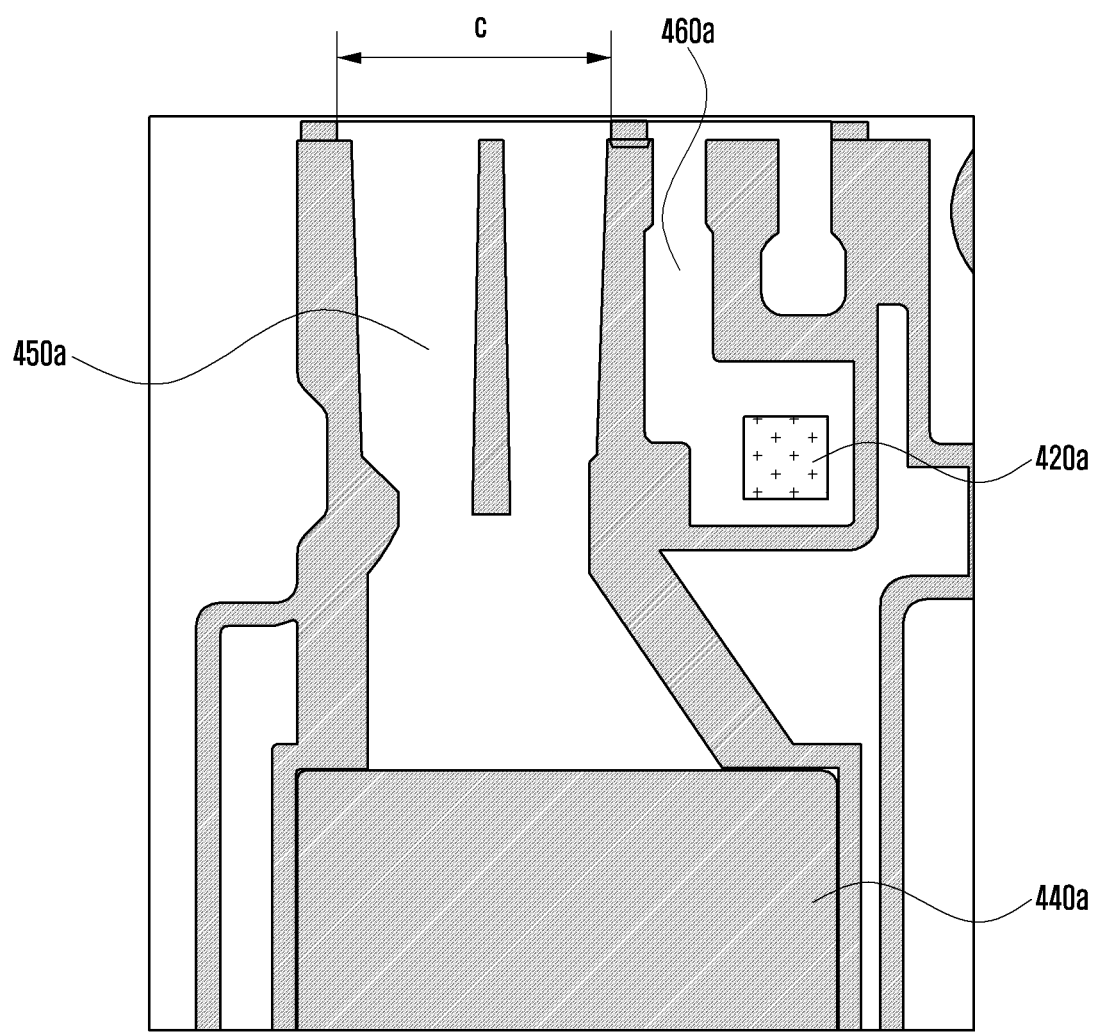
FIG. 4A shows a conventional mounting structure for a speaker and a sensor.

FIG. 4A shows a conventional mounting structure for a speaker 440a and a sensor 420a.

FIG. 4A is a cross-sectional view of the structure on which the speaker 440a and the sensor 420a are mounted. An electronic device may include the speaker 440a and the sensor 420a. For example, an electronic device may include a structure (e.g., passage 450a) for discharging a sound output by the speaker 440a. For example, the sensor 420a of the electronic device may be a sensor 420a based on a medium. For example, the sensor 420a may sense an outside environment of the electronic device through various media (e.g., air or water). In this case, the electronic device may include a structure (e.g., passage 460a) through which the media moves so that the media comes into contact with the sensor 420a.

Referring to FIG. 4A, an electronic device may include the passage 450a from which a sound from the speaker 440a is discharged and the passage 460a into which a medium is introduced. In a conventional technology, an electronic device includes the passage 450a from which a sound is discharged and the passage 460a into which a medium is introduced. For example, the passage 450a from which a sound is discharged and the passage 460a into which a medium is introduced are separated. A sound discharged from the speaker 440a and a medium coming into contact with the sensor 420a are independently discharged and introduced through holes connected to the respective passages. Accordingly, the electronic device has a spatial limit upon design in order to include the plurality of holes and the plurality of passages 450a and 460a. For example, there is a spatial limit in widening the size (c) of the passage 450a (or hole) through which a sound output by the speaker 440a is discharged or the size of the passage 460a (or hole) leading to the sensor 420a. For example, in the case of a sound discharged by the speaker 440a, performance can be improved only when a wide passage and hole are provided. A medium can be smoothly introduced into the sensor 420a through a wide passage and hole, and performance can be improved only when an area coming into contact with the medium is wide. Accordingly, it is difficult to optimize performance of the speaker 440a and the sensor 420a due to the spatial limit.

Figure 4B:
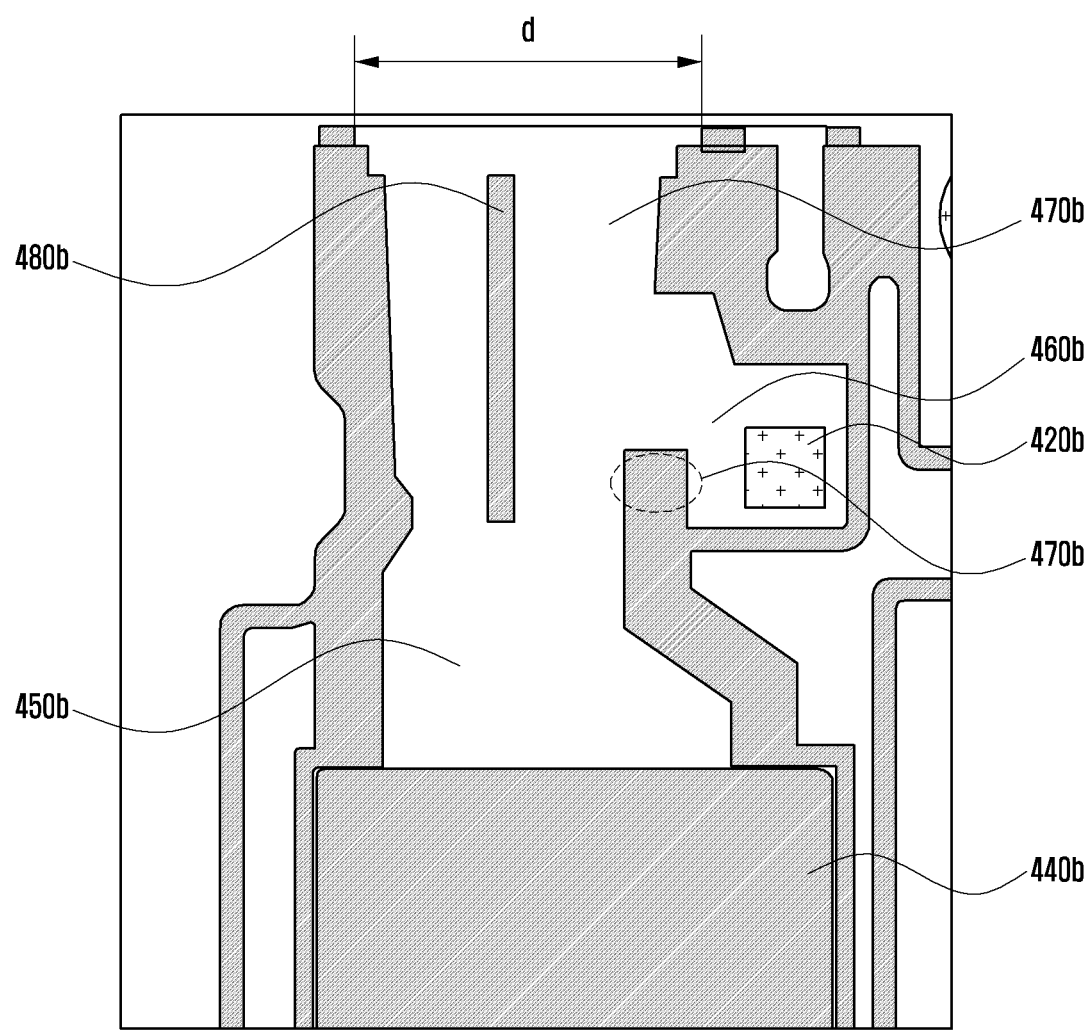
FIG. 4B shows a mounting structure for a speaker and a sensor according to various embodiments of the present disclosure.

FIG. 4B shows a mounting structure for a speaker 440b and a sensor 420b according to various embodiments of the present disclosure. FIG. 4B is a cross-sectional view of a structure in which the speaker 440b and the sensor 420b are mounted. An electronic device may include the speaker 440b and the sensor 420b. According to various embodiments, the sensor 420b may include the sensor 420b configured to sense an external environment based on various media (e.g., air or water). For example, the sensor 420b may include various sensors 420b, such as a temperature sensor 420b, a humidity sensor 420b, a gas sensor 420b (e.g., sensor 420b configured to sense a variety of types of gases), an alcohol sensor 420b, a dust sensor 420b, an air sensor 420b (or pollution sensor 420b), a pressure sensor 420b (e.g., a pneumatic sensor 420b or a water pressure sensor 420b) and a water quality sensor 420b. According to various embodiments, the sensor 420b may include the sensors 420b shown in the module 240 of the sensor 420b of FIG. 2.

According to various embodiments, an electronic device may include a first passage portion 450b connected to the speaker 440b, a second passage portion 460b connected to the sensor 420b, and a common passage portion 470b connected to the first passage portion 450b and the second passage portion 460b and connected to the outside. In accordance with one embodiment, a sound output by the speaker 440b may be discharged to the outside of an electronic device through the first passage portion 450b and the common passage portion 470b. A medium coming into contact with the sensor 420b may be introduced through the common passage portion 470b and the second passage portion 460b.

In accordance with various embodiments, an electronic device may include the first passage portion 450b through which a sound output by the speaker 440b moves, the second passage portion 460b through which a medium to the sensor 420b moves, and the common passage portion 470b that is a common moving passage for the sound and the medium. For example, since the common passage portion 470b is a passage through which both the sound and the medium move, an electronic device does not include a plurality of holes related to the speaker 440b and the sensor 420b, but may include a single common hole. In accordance with various embodiments, since an electronic device includes only a single hole related to the speaker 440b and the sensor 420b, the width (or area) (d) of the hole can be wide compared to a case where holes related to the speaker 440b and the sensor 420b are included. According to various embodiments, an electronic device includes the single common passage portion 470b in common used by a sound for the speaker 440b and a medium for the sensor 420b. Accordingly, the space of a passage can be expanded compared to a case where a passage through which a sound from the speaker 440b is discharged and a passage through which a medium for the sensor 420b moves are separately included. In accordance with various embodiments of the present disclosure, since the space of a passage (e.g., common passage portion 470b) through which a sound or medium moves is expanded, a sound discharged from the speaker 440b can be output to the outside of an electronic device more smoothly and a medium coming into contact with the sensor 420b may be introduced more smoothly. In accordance with various embodiments of the present disclosure, performance of the speaker 440b and the sensor 420b can be improved because a sound discharged from the speaker 440b and a medium introduced into the sensor 420b move smoothly.

In accordance with one embodiment, the first passage portion 450b may be formed from the space in which the speaker 440b is positioned toward the external direction of an electronic device. The first passage portion 450b may be a passage through which a sound output by the speaker 440b is discharged. In accordance with one embodiment, the internal space of the first passage portion 450b may be formed to be narrowed from the portion of the speaker 440b toward a portion connected to the common passage portion 470b. For example, at least one part of the first passage portion 450b may have a given slant so that the internal space is narrowed toward the direction opposite the speaker 440b. For another example, at least part of the first passage portion 450b may be formed to have a curved structure or bent structure so that the internal space is narrowed toward the direction opposite the speaker 440b. According to various embodiments, since the first passage portion 450b has a structure narrowed toward the direction opposite the speaker 440b, it may collect sounds output by the speaker 440b and deliver them to the common passage portion 470b. According to various embodiments, a sound output by the speaker 440b can be smoothly output to the outside of an electronic device through the common passage portion 470b without being introduced into the second passage portion 460b due to the structure (e.g., slanted structure) of the first passage portion 450b.

In accordance with one embodiment, the second passage portion 460b may be a passage extended from the space in which the sensor 420b is positioned to the external direction (e.g., the common passage portion 470b) of an electronic device. In accordance with one embodiment, the second passage portion 460b may be connected to one side of the first passage portion 450b or the common passage portion 470b. For example, if the sensor 420b is disposed on the side of the first passage portion 450b or the common passage portion 470b, the second passage portion 460b may be a passage to connect the space in which the sensor 420b is positioned and the first passage portion 450b or the common passage portion 470b. In accordance with one embodiment, the second passage portion 460b may be a passage through which a medium (e.g., air or water) introduced from the outside of an electronic device moves to the sensor 420b. In accordance with one embodiment, one end of the first passage portion 450b and one end of the second passage portion 460b may be interconnected. According to various embodiments, the first passage portion 450b, the second passage portion 460b and the common passage portion 470b may be integrated.

In accordance with one embodiment, the common passage portion 470b may be formed in a radial structure widened in the external direction of an electronic device (e.g., a direction opposite the speaker 440b). For example, the common passage portion 470b may be formed in a radial structure so that a sound discharged by the speaker 440b can be smoothly spread toward the outside of an electronic device.

In accordance with one embodiment, the common passage portion 470b may include a guide part 480b for controlling the moving direction of a sound or medium therein. For example, the guide part 480b may be a guide plate formed within the common passage portion 470b. For example, the guide part 480b may guide the moving direction of a sound so that the sound output by the speaker 440b smoothly moves to the outside of an electronic device.

In accordance with one embodiment, an electronic device may further include a protruded part 470b at a contact point where the first passage portion 450b and the second passage portion 460b are connected. For example, the protruded part 470b can prevent a sound output by the speaker 440b from entering the second passage portion 460b. The protruded part 470b may enable an externally introduced medium to smoothly enter the second passage portion 460b. In accordance with one embodiment, the protruded part 470b may have a given slant. For example, the protruded part 470b may be formed in a form expanded from the boundary of the first passage portion 450b and the second passage portion 460b toward the direction of the common passage portion 470b. Furthermore, in accordance with one embodiment, the protruded part 470b may be formed in a diaphragm structure of a mesh form through which a medium can pass.

Furthermore, a case where the speaker 440b is connected to the first passage portion 450b and the sensor 420b is connected to the second passage portion 460b has been illustrated, but the deployment of the speaker 440b and the sensor 420b may be modified variously. For example, according to another embodiment, the positions of the sensor 420b and the speaker 440b may be swapped, so the sensor 420b may be connected to the first passage portion 450b and the speaker 440b may be connected to the second passage portion 460b.

FIGS. 5 to 10 are diagrams showing structures including the sensors and speakers of electronic devices according to various embodiments of the present disclosure. In this case, an appearance and shape of the structure is not limited to the shown structures and may be changed depending on various embodiments. Structures according to various embodiments of the present disclosure are described with reference to FIGS. 5 to 10.

Figure 5:
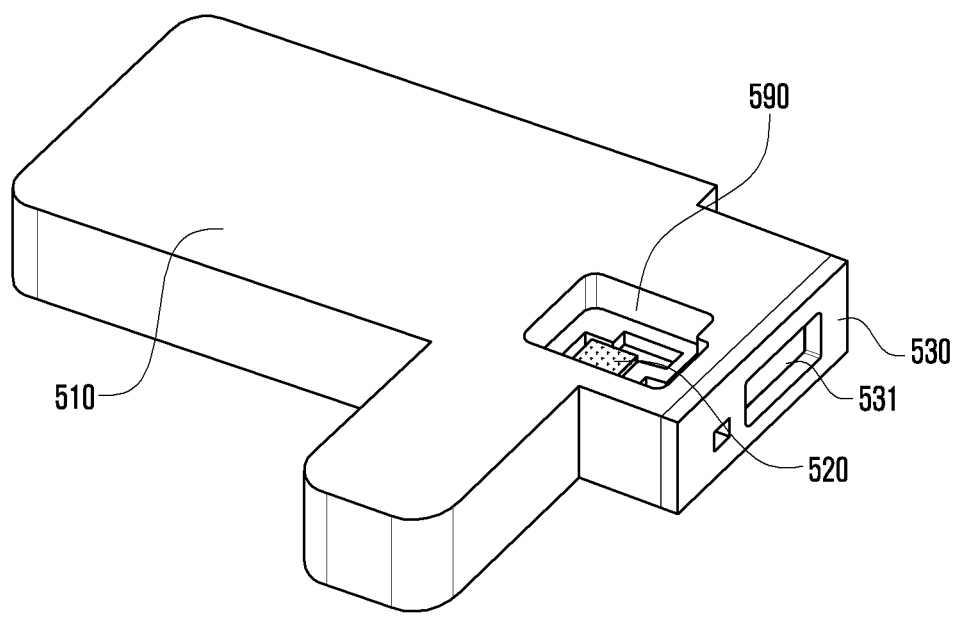
FIG. 5 is a perspective view of a structure including the sensor and speaker of an electronic device according to various embodiments of the present disclosure.

FIG. 5 is a perspective view of a structure including the sensor and speaker of an electronic device according to various embodiments of the present disclosure.

In accordance with one embodiment, an electronic device may include a structure including a sensor and a speaker. For example, the structure may be a single module on which a sensor and speaker used in an electronic device are mounted.

In accordance with one embodiment, the structure may include a main body casing 510 on which a sensor 520 and a speaker are mounted therein and a side casing 530 in which an external hole is formed. In accordance with one embodiment, the main body casing 510 may include the sensor 520 and a speaker therein. In accordance with one embodiment, the side casing 530 may include an opening portion 531 connected to a passage within the main body casing 510. A sound discharged by a speaker or an externally introduced medium may move through the opening portion 531 and the passage of the main body casing 510. In accordance with one embodiment, the side casing 530 may be connected to a hole formed in one side of an electronic device (e.g., one side of the housing of an electronic device). For example, a sound discharged by a speaker may be discharged to the outside of an electronic device and a medium may be introduced into the electronic device (e.g., within the structure) through the hole formed in one side of the electronic device. In accordance with one embodiment, the main body casing 510 may include a passage 590 connected from the sensor 520 mounted therein to communicate with the outside of the structure through the upper side of the main body casing 510. In accordance with one embodiment, at least part of the sensor 520 may be exposed to the outside of the structure through the passage 590.

Figure 6:
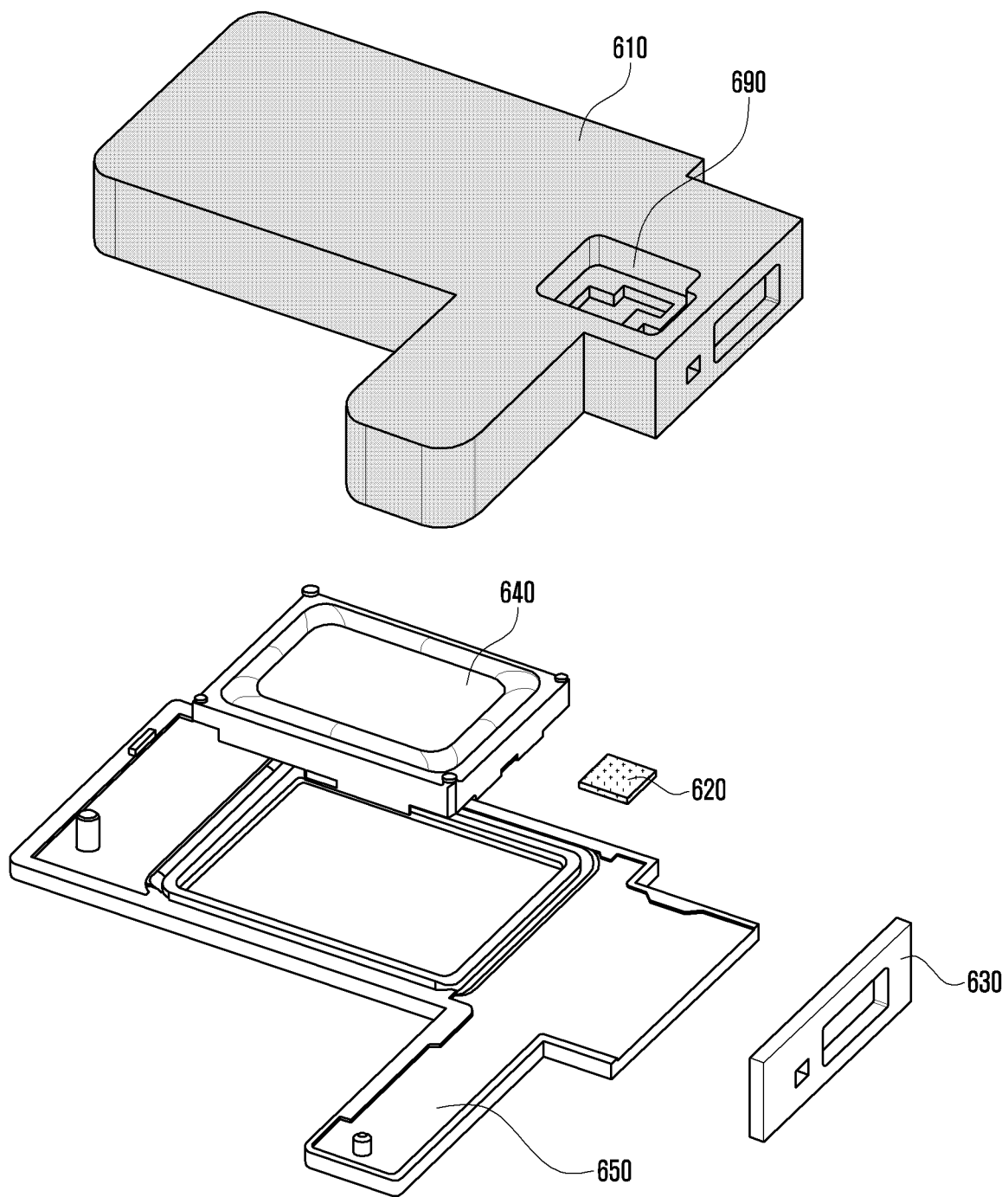
FIG. 6 is an exploded perspective view of a structure including the sensor and speaker of an electronic device according to various embodiments of the present disclosure.

FIG. 6 is an exploded perspective view of a structure including the sensor and speaker of an electronic device according to various embodiments of the present disclosure.

In accordance with one embodiment, the structure may include a lower casing 650 on which a sensor 620 and a speaker 640 are mounted, an upper casing 610 in which at least one passage connected to the sensor 620 and the speaker 640 is formed, and a side casing 630.

A space in which the sensor 620 and the speaker 640 may be disposed may be formed in the lower casing 650. For example, the space of the lower casing 650 in which the sensor 620 or the speaker 640 is positioned may include a fixed structure (e.g., a separation prevention structure corresponding to the size of the speaker 640 or sensor 620) in order to prevent the separation of the sensor 620 or the speaker 640.

In accordance with one embodiment, the upper casing 610 may be coupled to the lower casing 650 on which the speaker 640 and the sensor 620 are mounted. The upper casing 610 may include at least one passage connected to the speaker 640 and the sensor 620 therein. For example, the upper casing 610 may include a first passage portion connected to the speaker 640, a second passage portion connected to the sensor 620, and a common passage portion connected to the first passage portion and the second passage portion to communicate with the outside of the structure. In accordance with one embodiment, the upper casing 610 may include a third passage portion 690 connected from the sensor 620 to the upper side. In accordance with one embodiment, the third passage portion 690 may be connected to the second passage portion.

Figure 7:
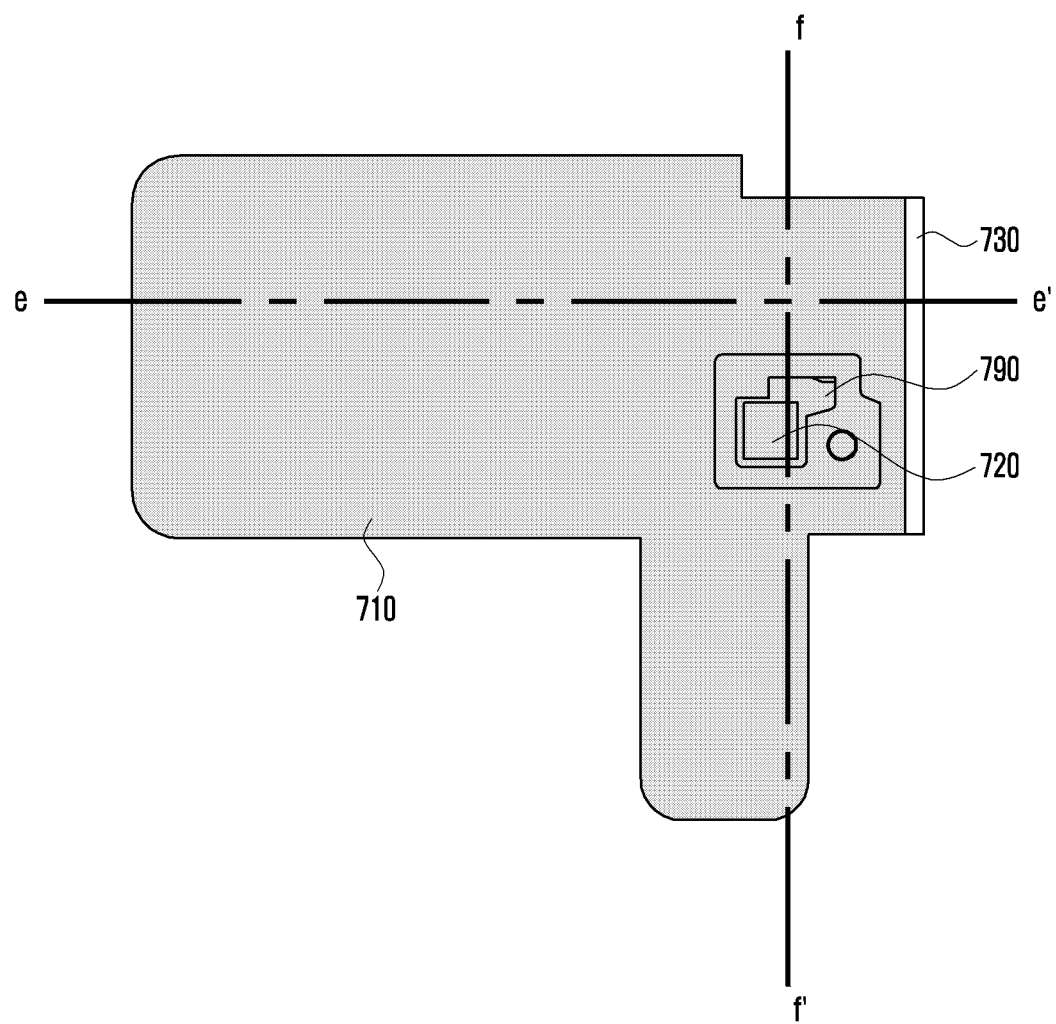
FIG. 7 is a plan view of a structure including the sensor and speaker of an electronic device according to various embodiments of the present disclosure.

FIG. 7 is a plan view of a structure including the sensor and speaker of an electronic device according to various embodiments of the present disclosure.

In accordance with one embodiment, the structure may have a generally rectangular form. According to various embodiments, the shape of the structure is not limited to the rectangular form and may have various forms.

In accordance with one embodiment, a side casing 730 may be connected to one end of a structure (e.g., an upper casing 710). For example, one side of the structure may include a passage to communicate with a speaker or sensor 720 therein. For example, one end of the structure may include the side casing 730 having an opening portion. The upper side of the structure may include a third passage portion 790. For example, the third passage portion 790 may be perpendicularly connected to the first passage portion and second passage portion within the structure to communicate with the outside of the structure through the upper side of the structure. For example, the third passage portion 790 may be connected to the sensor 720 (i.e., the space in which the sensor 720 is positioned). In accordance with one embodiment, at least part of the sensor 720 may be exposed to the outside through the third passage portion 790. In accordance with one embodiment, a medium introduced through the third passage portion 790 may come into contact with the sensor 720.

Figure 8:
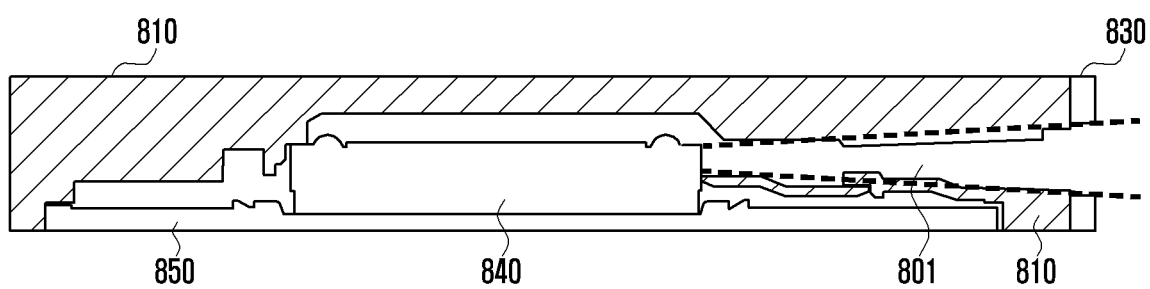
FIG. 8 shows a cross-sectional view of a structure including the sensor and speaker of an electronic device according to various embodiments of the present disclosure.

FIG. 8 shows a cross-sectional view of a structure including the sensor and speaker of an electronic device according to various embodiments of the present disclosure. FIG. 8 shows a cross section of the structure taken along a cutting-plane line e-e' of FIG. 7.

In accordance with one embodiment, the structure may include a lower casing 850 on which a speaker 840 is mounted and an upper casing 810 including at least one passage portion. In accordance with one embodiment, the speaker 840 may discharge a sound in one direction. The passage portion 801 of the structure may be formed in the direction in which the speaker 840 discharges a sound to communicate with the outside of the structure. For example, the passage portion 801 (e.g., a first passage portion and a common passage portion) of the structure may be formed in a radial structure widened toward the external direction of the structure. That is, the passage portion 801 of the structure is formed in the radial structure, so a sound discharged by the speaker 840 can be discharged to the outside of the structure more smoothly.

Figure 9:
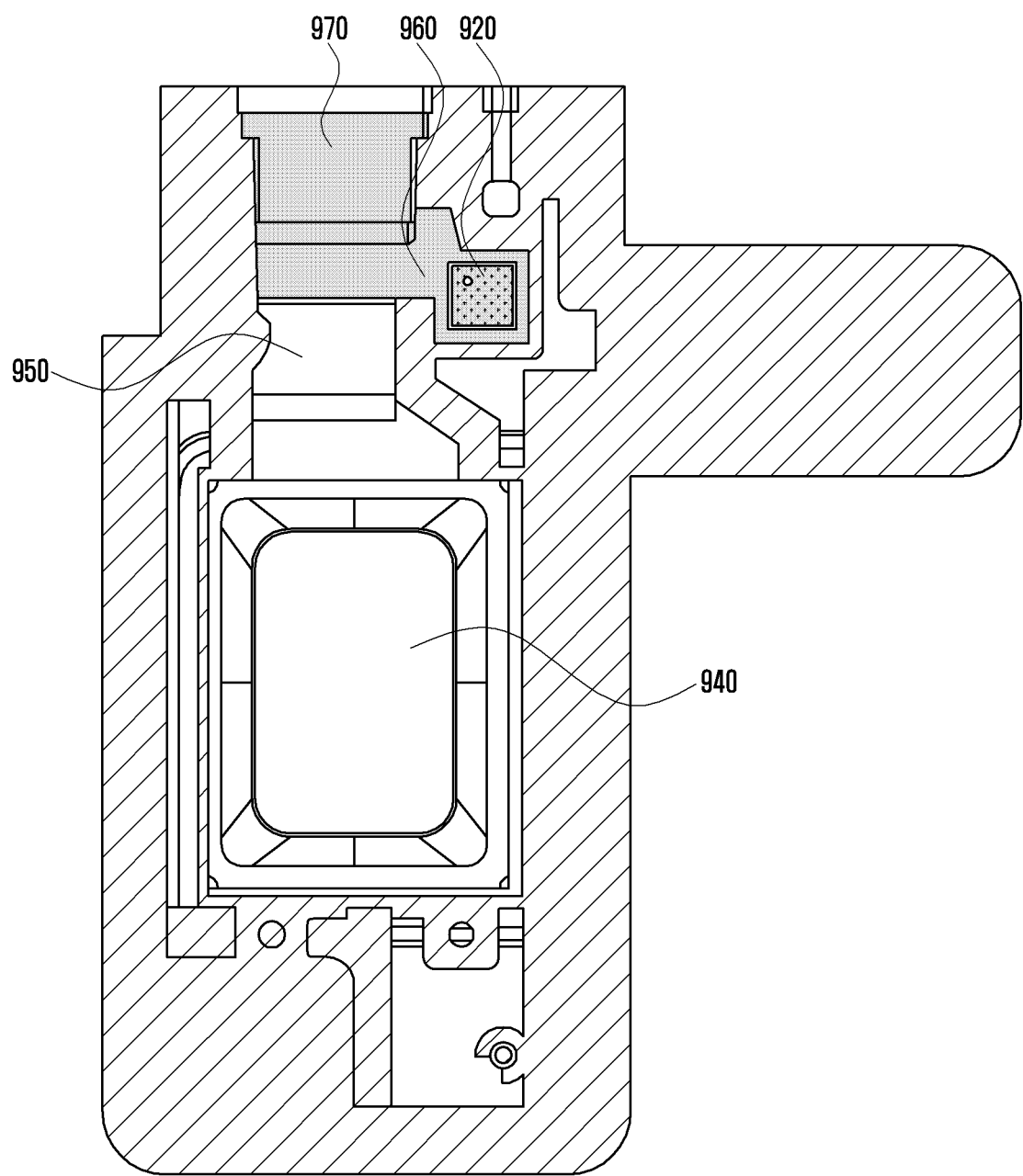
FIG. 9 shows a cross-sectional view of a structure including the sensor and speaker of an electronic device according to various embodiments of the present disclosure.

FIG. 9 shows a cross-sectional view of a structure including the sensor and speaker of an electronic device according to various embodiments of the present disclosure. FIG. 9 shows a cross section of the structure of FIG. 7 taken based on a height axis.

In accordance with one embodiment, a speaker 940 and a sensor 920 may be disposed within the structure. In accordance with one embodiment, the sensor 920 may be positioned closer to the outside of the structure than the speaker 940. In accordance with various embodiments, the sensor 920 may be positioned on one side of the speaker 940 or may be mounted on the same plane as the speaker 940 or a plane (e.g., different height) different than the plane of the speaker 940.

In accordance with one embodiment, the structure may include a first passage portion 950 connected from the speaker 940, a second passage portion 960 connected from the sensor 920, and a common passage portion 970. In accordance with one embodiment, the first passage portion 950, the second passage portion 960 and the common passage portion 970 may be integrated.

In accordance with one embodiment, a sound discharged by the speaker 940 may be discharged to the outside of the structure through the first passage portion 950 and the common passage portion 970. An externally introduced medium may come into contact with the sensor 920 through the common passage portion 970 and the second passage portion 960.

Figure 10A:
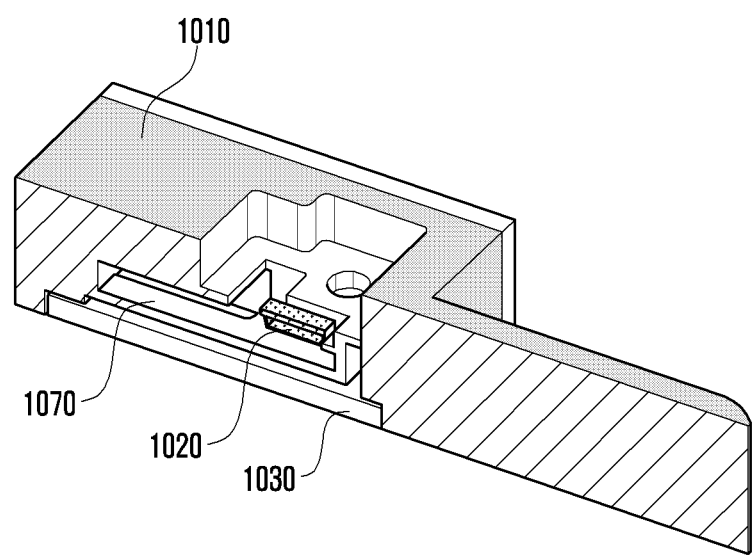
FIG. 10A is a perspective view showing a cross section of a structure including the sensor and speaker of an electronic device according to various embodiments of the present disclosure.
Figure 10B:
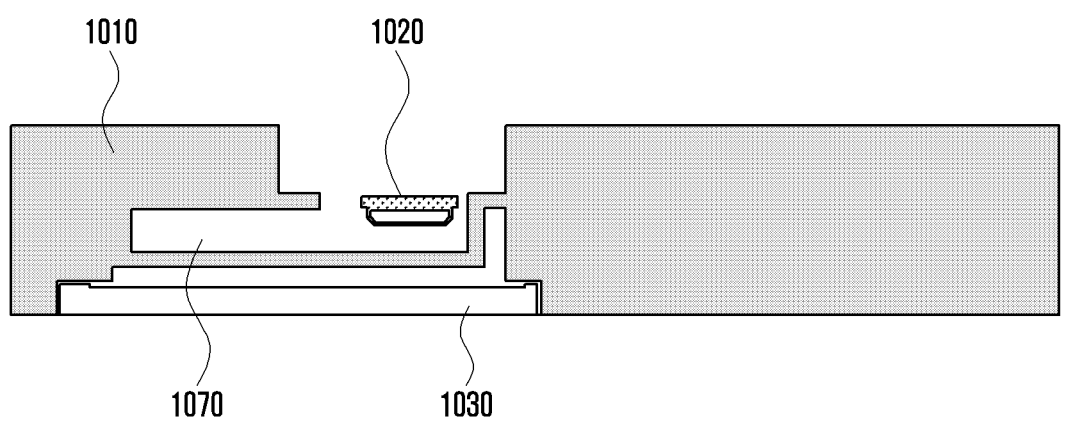
FIG. 10B shows a cross-sectional view of a structure including the sensor and speaker of an electronic device according to various embodiments of the present disclosure.

FIGS. 10A and 10B are diagrams showing cross sections of a structure including the sensor and speaker of an electronic device according to various embodiments of the present disclosure. FIGS. 10A and 10B are diagrams showing cross sections of the structure of FIG. 7 taken along a cutting-plane line f-f'.

According to various embodiments, a sensor 1020 may be fixed by at least part of a lower casing 1030 and an upper casing 1010. In accordance with various embodiments, the sensor 1020 may be positioned in various spaces around the speaker within the casing. Referring to FIGS. 10A and 10B, a first passage portion and a second passage portion may be interconnected to form a single passage 1070. For example, the first passage portion connected to the speaker and the second passage portion connected to the sensor 1020 may be interconnected and integrated with the single passage 1070 (e.g., a common passage portion) to communicate with the outside of the structure.

In accordance with one embodiment, the structure may include a third passage portion to communicate with the top of the sensor 1020, that is, the upper side of the structure. The third passage portion may be a passage into which a medium for the sensor 1020 is introduced. The third passage portion may be formed in a direction perpendicular to the first passage portion, second passage portion and common passage portion. The third passage portion may be connected to the space in which the sensor 1020 is positioned and the second passage portion. At least part of the sensor 1020 (e.g., the top of the sensor 1020) may be exposed to the outside of the structure through the third passage portion. The third passage portion increases the amount of media (e.g., the medium contact surface of the sensor 1020) coming into contact with the sensor 1020, being capable of increasing sensing efficiency of the sensor 1020.

Figure 11:
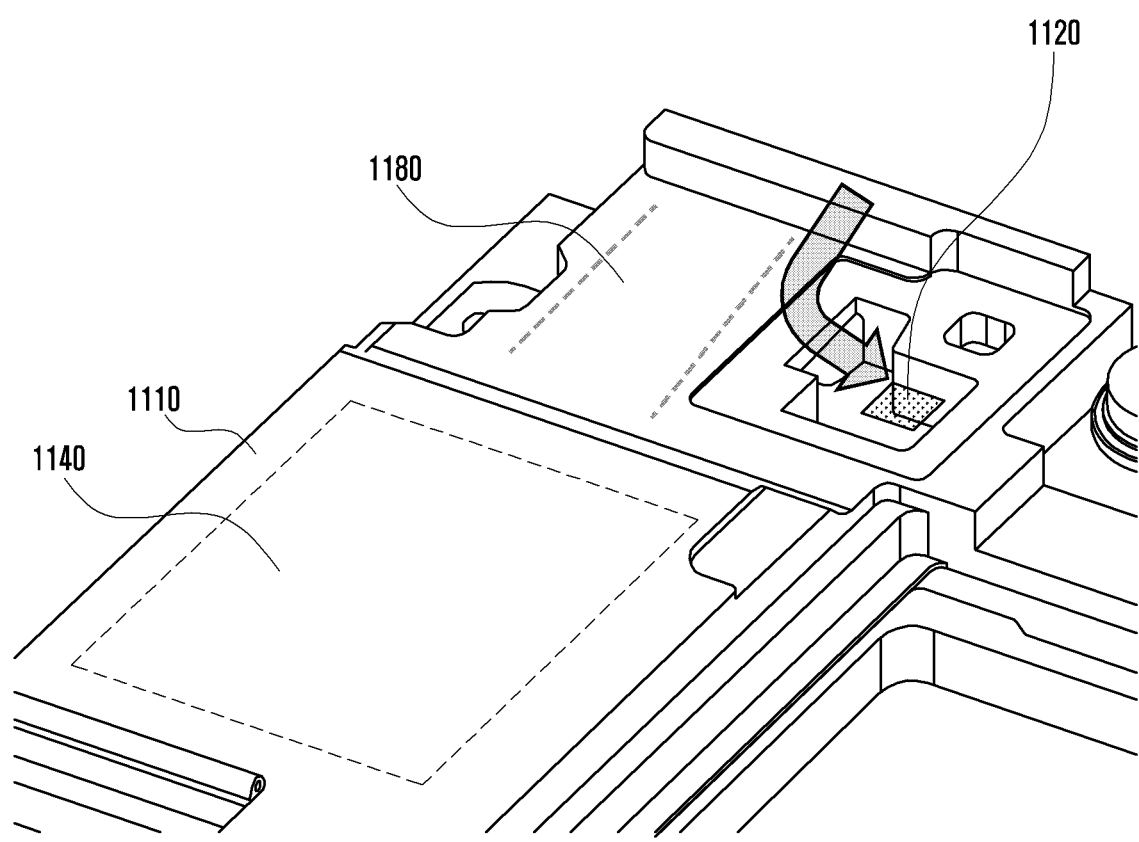
FIG. 11 is a diagram showing a structure including the sensor and speaker of an electronic device according to various embodiments of the present disclosure.

FIG. 11 is a diagram showing a structure including the sensor and speaker of an electronic device according to various embodiments of the present disclosure.

In accordance with one embodiment, the structure 1110 may include a speaker 1140 and a sensor 1120. For example, the speaker 1140 may be positioned in a given area within the structure 1110. The structure 1110 may include a passage 1280 (e.g., a duct structure) for discharging a sound output by the speaker 1140 to the outside. In accordance with one embodiment, the sensor 1120 may be positioned on one side of the passage 1280 to which a sound from the speaker 1140 is output. In accordance with one embodiment, the structure 1110 may include a passage connected to the passage 1280 through which the sound of the speaker 1140 is discharged, for allowing an externally introduced medium to pass therethrough. For example, at least part of the passage of the structure 1110 may be a passage through which a sound or a medium moves in common.

In accordance with one embodiment, the structure 1110 may include an opening portion at the top of a portion where the sensor 1120 is positioned. For example, the structure 1110 may include a passage to communicate with the outside of the structure 1110 at the top of the sensor 1120. A medium may be introduced from the outside through the passage at the top of the structure 1110 and may come into contact with the sensor 1120.

Figure 12A:
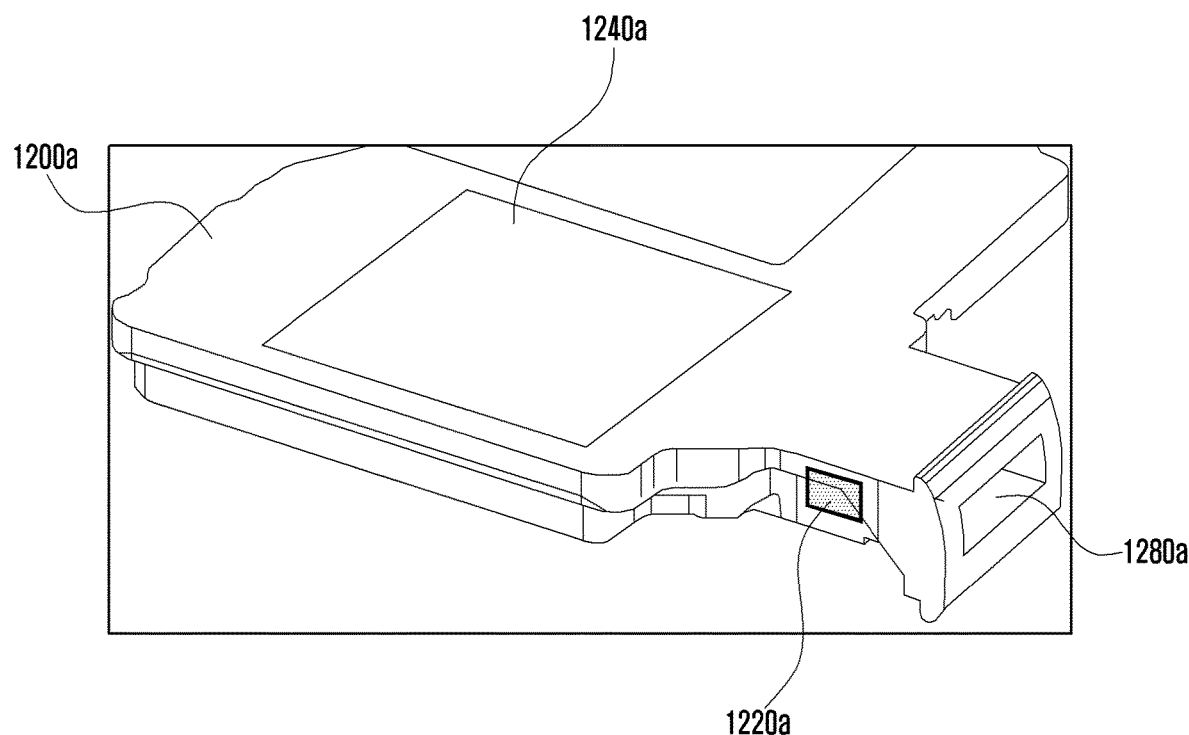
FIG. 12A is a diagram for illustrating a structure including the sensor and speaker of an electronic device according to various embodiments of the present disclosure.
Figure 12A:
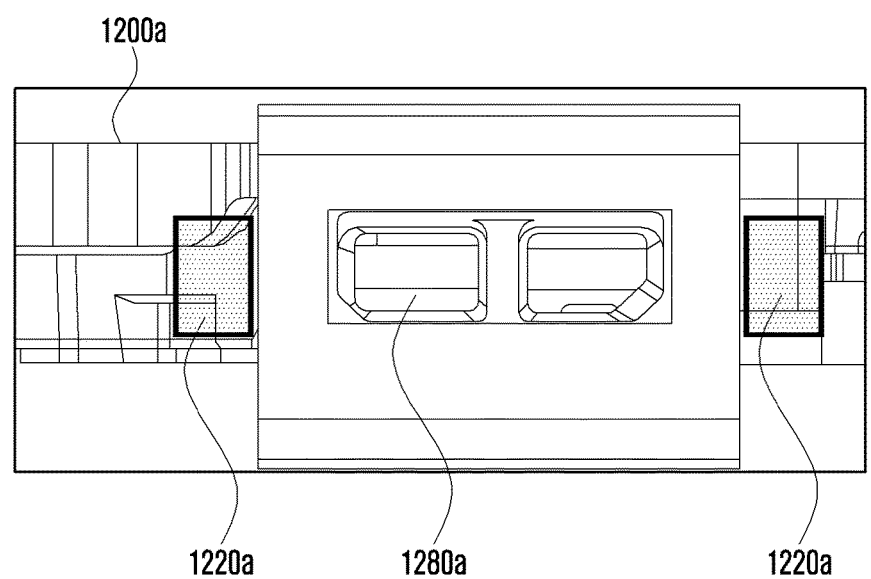
Figure 12B:
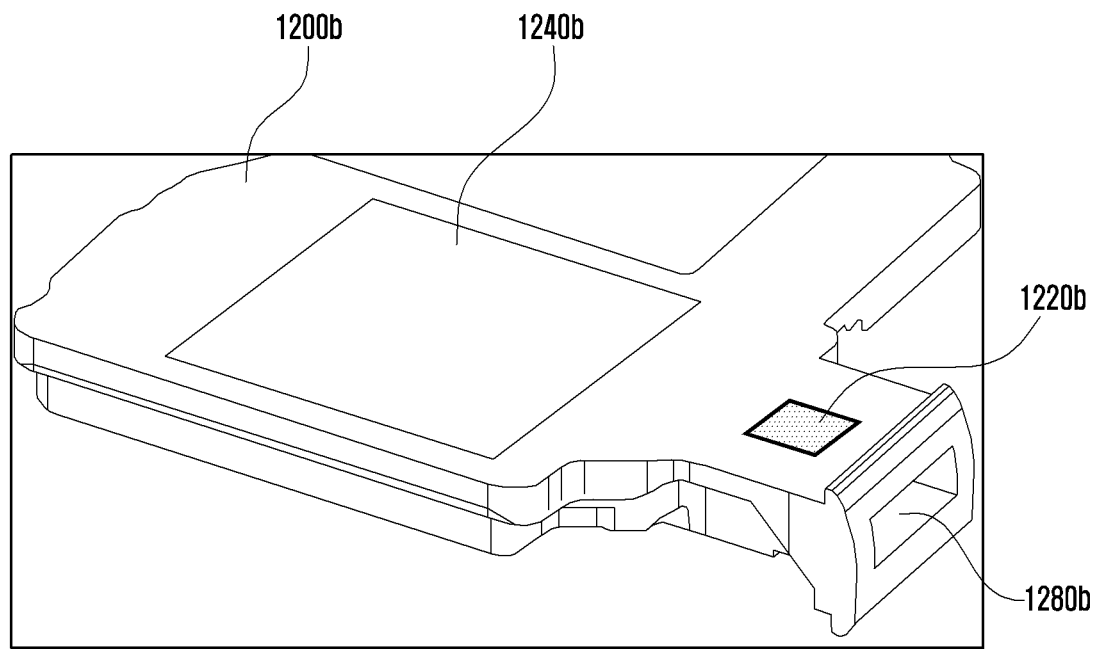
FIG. 12B is a diagram for illustrating a structure including the sensor and speaker of an electronic device according to various embodiments of the present disclosure.
Figure 12B:
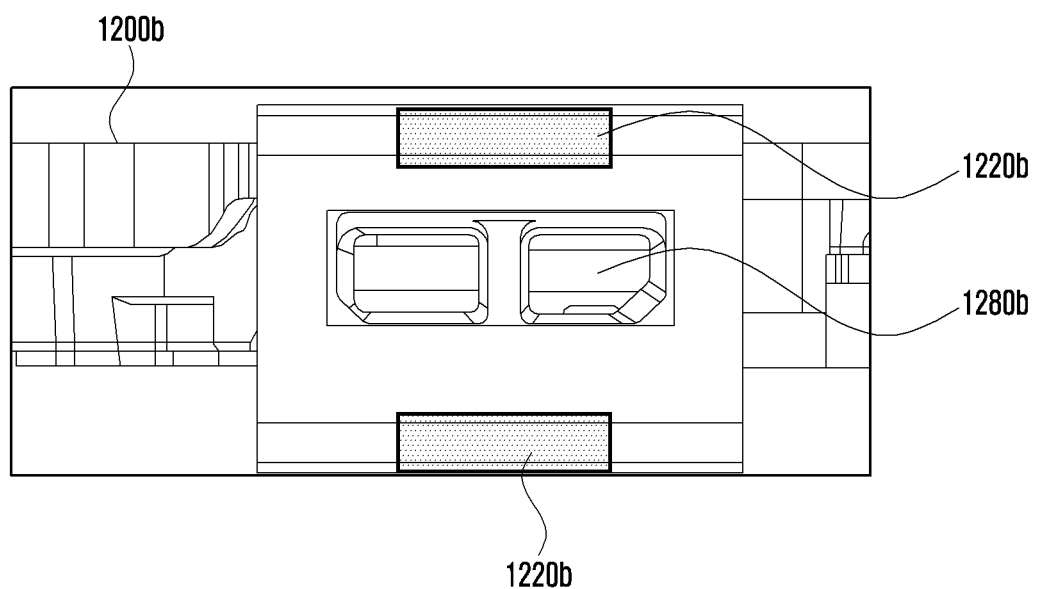

FIG. 12A is a diagram for illustrating a structure including the sensor and speaker of an electronic device according to various embodiments of the present disclosure. The upper drawing of FIG. 12A is a perspective view of the structure according to an embodiment of the present disclosure, and the lower drawing thereof is a side view of the structure in the direction of a passage (e.g., a duct). The upper drawing of FIG. 12B is a perspective view of the structure according to another embodiment of the present invention, and the lower drawing thereof is a side view of the structure in the direction of the passage (e.g., a duct).

Referring to FIG. 12A, an electronic device according to one embodiment may include a structure 1200a including a sensor 1220a and a speaker 1240a. The structure 1200a may include a passage connected to the sensor 1220a and the speaker 1240a. For example, the passage of the structure 1200a may be a channel through which a sound output by the speaker 1240a and a medium introduced from the outside for the sensing of the sensor 1220a move.

In accordance with one embodiment, in the structure 1200a, a sound and medium may move to the inside or outside of the structure 1200a through a single opening portion 1280a. For example, the passage of the structure 1200a may be formed so that a sound or medium can move in common. According to various embodiments of the present disclosure, since passages to communicate with the speaker 1240a and the sensor 1220a are integrated, the utilization area of an internal space is widened compared to a case where the passages to communicate with the speaker 1240a and the sensor 1220a, respectively, are independently formed. Furthermore, performance of the speaker 1240a and the sensor 1220a can be improved because the discharge of a sound output by the speaker 1240a and a movement of a medium for the sensing of the sensor 1220a are facilitated.

According to various embodiments, the sensor 1220a may be positioned at various locations where the passage may be used in common with the speaker 1240a. For example, the sensor 1220a may be positioned on one side of the passage through which a sound output by the speaker 1240a is discharged. According to various embodiments, the structure 1200a may include at least one sensor 1220a. For example, the structure 1200a may include one sensor 1220a on one side of the passage or may include sensors 1220a on both sides of the passage. According to various embodiments, the structure 1200a may include the sensor 1220a within the passage (e.g., duct). For example, the structure 1200a may include a structure (e.g., the passage connected to the sensor 1220a and the structure in which the sensor 1220a is disposed) for mounting the sensor 1220a on the exterior wall of the passage through which a sound from the speaker 1240a is discharged.

Referring to FIG. 12B, a sensor 1220b according to an embodiment of the present disclosure may be positioned around a passage (e.g., an opening portion 1280b) through which a sound output by a speaker 1240b is discharged. For example, the sensor 1220b may be positioned at the top or bottom within the passage through which a sound output by a speaker 1240b is discharged. For example, the structure 1200b may include one sensor 1220b at the top or bottom of the passage or may include sensors 1220b at the top and bottom of the passage.

According to various embodiments of the present disclosure, the location where the sensor 1220a, 1220b is positioned in the structure 1200a, 1200b is not limited to the cases of FIGS. 12A and 12B, but may be positioned at various locations closer to the speaker 1240a, 1240b. In accordance with various embodiments, the location where the speaker 1240a, 1240b is positioned and the location where the sensor 1220a, 1220b is positioned may be reversed. For example, in FIGS. 12A and 12B, the sensor 1220a, 1220b may be positioned at the location where the speaker 1240a, 1240b is shown, and the speaker 1240a, 1240b may be positioned at the location where the sensor 1220a, 1220b is shown.

Figure 13A:
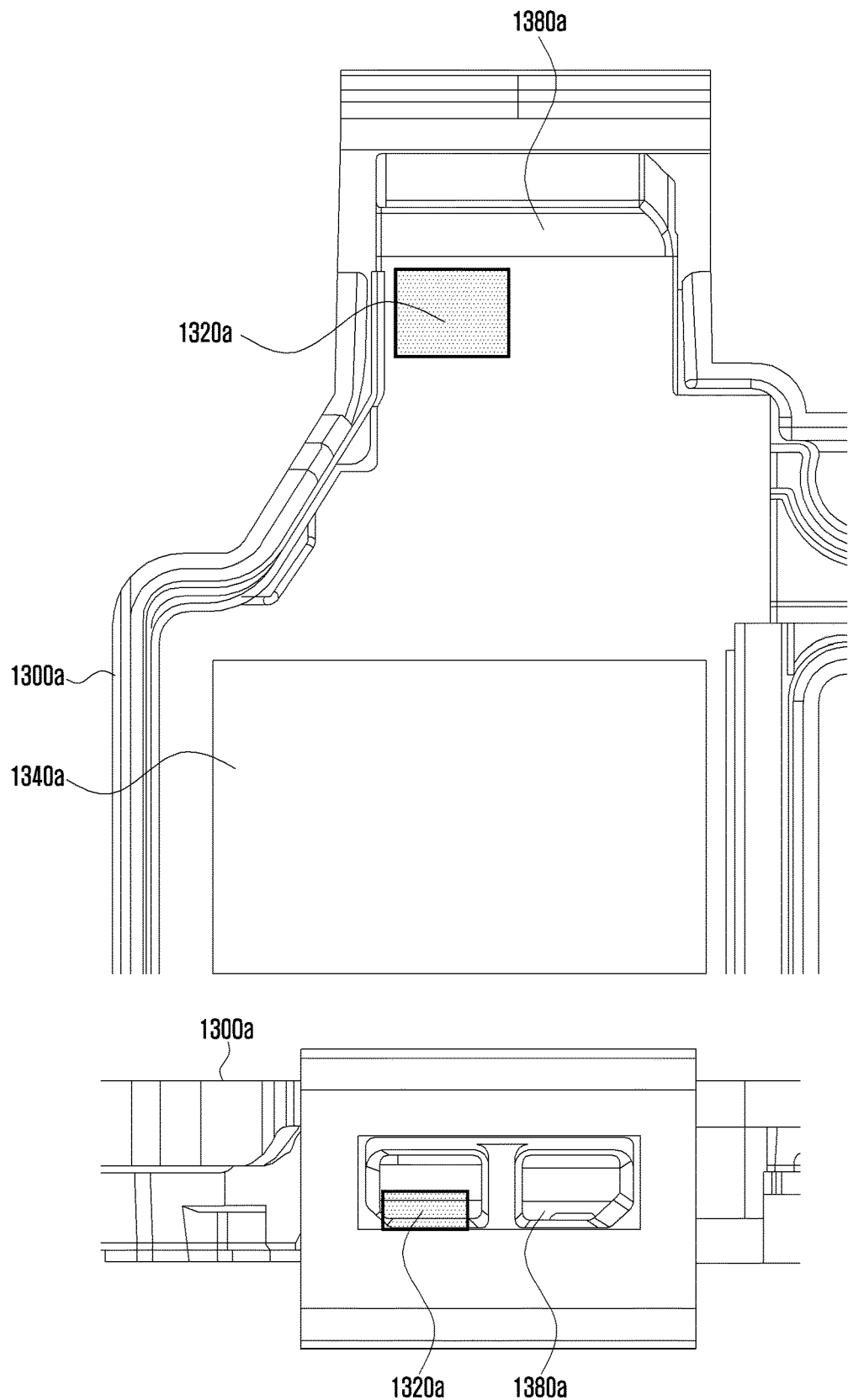
FIG. 13A is a diagram for illustrating a structure including the sensor and speaker of an electronic device according to various embodiments of the present disclosure.
Figure 13B:
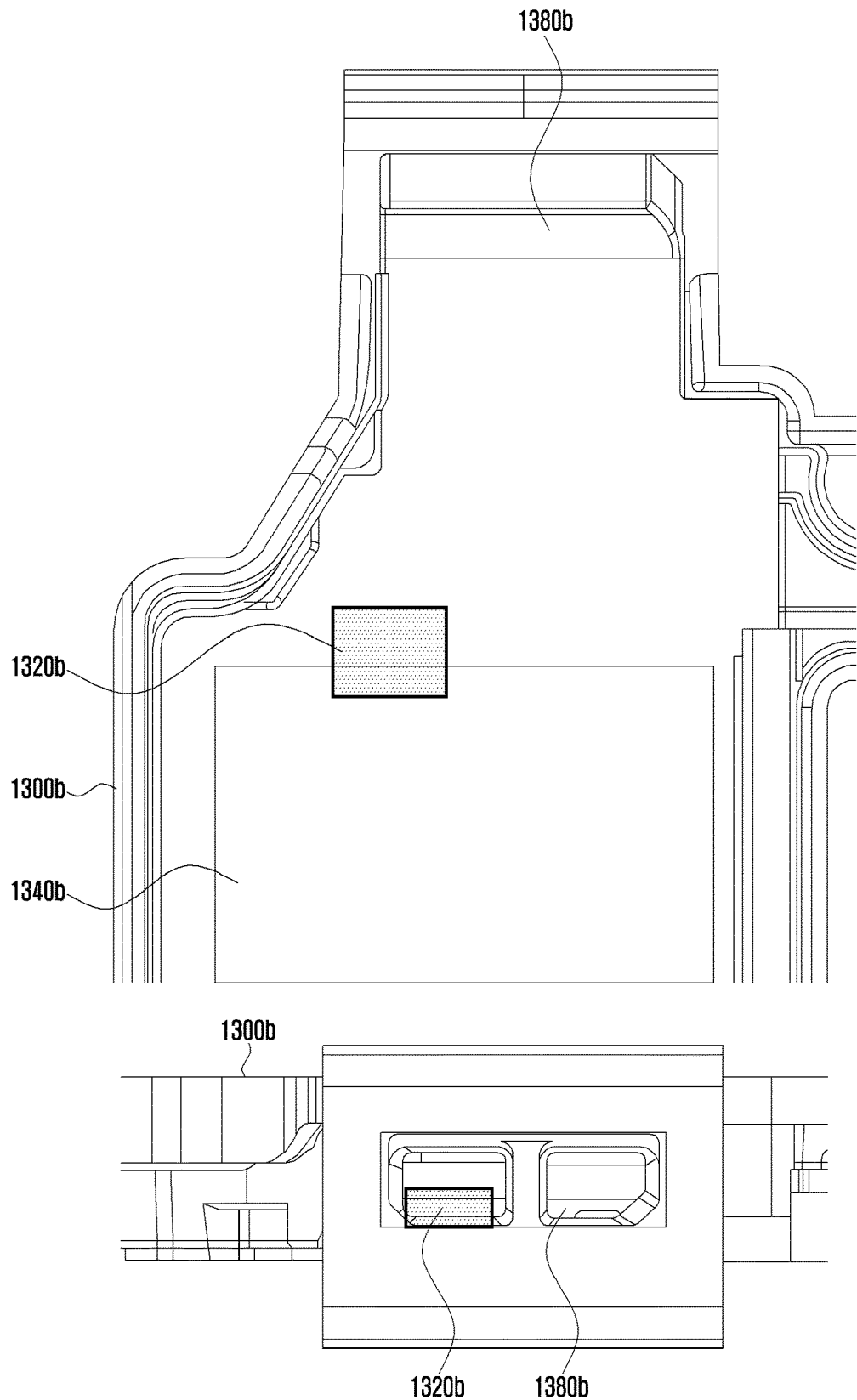
FIG. 13B is a diagram for illustrating a structure including the sensor and speaker of an electronic device according to various embodiments of the present disclosure.

FIGS. 13A and 13B are diagrams for illustrating structures including the sensors and speakers of electronic devices according to various embodiments of the present disclosure. The upper drawing of FIG. 13A shows an internal structure of a structure according to an embodiment of the present disclosure, and the lower drawing thereof is a side view of the structure in the direction of a passage (e.g., duct) according to one embodiment. The upper drawing of FIG. 13B shows an internal structure of a structure according to another embodiment of the present invention, and the lower drawing thereof is a side view of the structure in the direction of the passage (e.g., duct) according to another embodiment.

Referring to FIG. 13A, an electronic device may include a structure 1300a including a sensor 1320a and a speaker 1340a. The structure 1300a may include a passage 1380a connected to the sensor 1320a and the speaker 1340a. For example, the passage 1380a of the structure 1300 may be a channel through which a sound output by the speaker 1340a and a medium introduced from the outside for the sensing of the sensor 1320a move.

According to various embodiments, the sensor 1320a may be positioned at various locations where the passage 1380a may be used in common with the speaker 1340a. For example, the sensor 1320a may be positioned in a portion of the passage 1380a through which a sound output by the speaker 1340a is discharged. For example, referring to FIG. 13A, the sensor 1320a may be positioned in a portion (e.g., around the hole of the structure 1300a) of the passage 1380a through which a sound output by the speaker 1340a is discharged to the outside of the structure 1300a.

Referring to FIG. 13B, according to various embodiments, a sensor 1320b within a structure 1300b may be positioned at a location at least partially overlapping a speaker 1340b. For example, the sensor 1320b may be positioned closer to the speaker 1340b. For example, the sensor 1320b may be positioned at a height different from the height of the speaker 1340b at the location where the speaker 1340b is positioned. In accordance with one embodiment, the sensor 1320b and the speaker 1340b may share the moving passage of a sound and medium. For example, a sound output by the speaker 1340b may be discharged to the outside of the structure 1300b through the passage (e.g., an opening portion 1380b). A medium may be introduced from the outside of the structure 1300b through the passage 1380b and may come into contact with the sensor 1320b.

According to various embodiments of the present disclosure, the location where the sensor 1320a, 1320b is positioned in the structure 1300a, 1300b is not limited to the cases of FIGS. 13A and 13B and may be positioned at various locations close to the speaker 1340a, 1340b.

The "module" used in this document may include a unit including hardware, software or firmware and may be interchangeably used with a term, for example, logic, a logical block, a part or a circuit. The "module" may be an integrated part, a minimum unit to perform one or more functions, or a part thereof. The "module" may be implemented mechanically or electronically, and may include an application-specific integrated circuit (ASIC) chip, field-programmable gate arrays (FPGAs) or a programmable logic device which performs some operations and which has been known or is to be developed, for example. At least some of a device (e.g., modules or functions thereof) or method (e.g., operations) according to various embodiments may be implemented as instructions stored in a computer-readable storage medium (e.g., the memory 130) in the form of a program module. If the instructions are executed by a processor (e.g., the processor 120), the processor may perform functions corresponding to the instructions. The computer-readable storage medium may include a hard disk, a floppy disk, magnetic media (e.g., magnetic tape), optical media (e.g., CD-ROM), a DVD, magneto-optical media (e.g., a floptical disk), and embedded memory. The instructions may include code generated by a compiler or code executable by an interpreter. The module or program module according to various embodiments may include at least one of the aforementioned elements, may omit some of the elements or may further include other elements. Operations performed by the module, program module or other elements according to various embodiments may be executed in a sequential, parallel, repetitive or heuristic manner or at least some operations may be executed in a different sequence or omitted or may further include other operations.

We claim:

1. An electronic device, comprising:
a structure configured to comprise a sensor and a speaker, wherein the structure is configured to comprise:
    a first passage portion connected to the speaker;
    a second passage portion connected to the sensor;
    a common passage portion connected to the first passage portion and the second passage portion to communicate with an outside of the structure; and
    a third passage portion connected to the sensor in a direction perpendicular to the second passage portion to communicate with, the outside of the structure;
    wherein a sound output by the speaker is discharged to the outside of the structure through the first passage portion and the common passage portion, and
    wherein a medium introduced from the outside of the structure comes into contact with the sensor through the common passage portion and the second passage portion and/or through the third passage portion; and
    a protruded part formed at a contact point where the first passage portion and the second passage portion are connected such that the sound output by the speaker is prevented from entering the second passage portion,
    wherein at least part, of the sensor is exposed to the outside of the structure through an opening of the third passage portion, the opening is arranged in line with one side of the sensor.

2. The electronic device of claim 1, wherein the common passage portion is formed in a radial structure widened in an external direction of the electronic device.

3. The electronic device of claim 1, wherein the first passage portion is configured to have an internal space narrowed from a portion connected to the speaker toward a portion connected to the common passage portion.

4. The electronic device of claim 1, wherein the second passage portion is connected to one side of the common passage portion.

5. The electronic device of claim 1, wherein the common passage portion comprises a guide part configured to control a moving direction of the sound or the medium within the common passage portion.

6. The electronic device of claim 5, wherein the protruded part is disposed between the guide part and the sensor, and is apart from the guide part.

7. The electronic device of claim 6, wherein the guide part includes a guide plate extended from one end near the protruded part to another end near an opening portion of the common passage portion.

8. The electronic device of claim 1, wherein the sensor is positioned on a side of the first passage portion or the common passage portion.

9. The electronic device of claim 1, wherein one end of the common passage portion is connected to a hole formed in one side of the electronic device to communicate with an outside of the electronic device.

10. The electronic device of claim 1, wherein the sensor is positioned at a top or bottom of the first passage portion or the common passage portion.

11. The electronic device of claim 1, wherein the structure is configured to comprise:
    a lower casing on which the sensor and the speaker are mounted; and
    an upper casing in which the first passage portion, second passage portion, and common passage portion are integrated.

12. The electronic device of claim 1, wherein the protruded part is formed in a diaphragm structure capable of communicating with the medium.

13. The electronic device of claim 1, wherein the protruded part is extended from where a first wall forming the first passage portion and a second wall forming the second passage portion are connected.

14. An electronic device, comprising:
a structure configured to comprise a sensor and a speaker, wherein the structure is configured to comprise:
    a first passage portion connected to the speaker,
    a second passage portion connected to the sensor,
    a common passage portion connected to the first passage portion and the second passage portion to communicate with an outside of the structure;
    a third passage portion connected to the sensor in a direction perpendicular to the second passage portion to communicate with the outside of the structure through an opening which is arranged in line with one side of the sensor exposing at least part of the sensor to the outside of the structure; and
    a protruded part formed at a contact point where the first passage portion and the second passage portion are connected such that the sound output by the speaker is prevented from entering the second passage portion,
    wherein the second passage portion and the third passage portion are interconnected.

15. The electronic device of claim 14, wherein at least part of the sensor is exposed to the outside of the structure through the third passage portion.

16. The electronic device of claim 9, wherein:
    the sound output by the speaker is discharged to the outside of the electronic device through the hole, and
    the medium is introduced into the electronic device through the hole.

* * * * *